United States Patent
Gadepally (12)

(10) Patent No.: US 6,225,666 B1
(45) Date of Patent: May 1, 2001

(54) LOW STRESS ACTIVE AREA SILICON ISLAND STRUCTURE WITH A NON-RECTANGULAR CROSS-SECTION PROFILE AND METHOD FOR ITS FORMATION

(75) Inventor: Kamesh V. Gadepally, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/430,349

(22) Filed: Oct. 29, 1999

(51) Int. Cl.[7] .......................... H01L 27/01; H01L 27/12; H01L 31/0392

(52) U.S. Cl. .......................................... 257/347; 257/401

(58) Field of Search .................................... 257/347, 348, 257/349, 350, 351, 352, 353, 354, 401

(56) References Cited

U.S. PATENT DOCUMENTS

| | | | |
|---|---|---|---|
| 4,183,134 | * | 1/1980 | Oehler et al. . |
| 4,381,202 | * | 4/1983 | Mori et al. . |
| 4,447,823 | * | 5/1984 | Maeguchi et al. . |
| 4,489,978 | * | 12/1984 | Sakurai . |
| 4,592,792 | | 6/1986 | Corboy, Jr. et al. ................. 148/175 |
| 4,698,316 | | 10/1987 | Corboy, Jr. et al. ................... 437/89 |
| 5,608,252 | * | 3/1997 | Nakato ............................... 257/347 |

OTHER PUBLICATIONS

M. Nandakumar, et al., *Shallow Trench Isolation for Advanced ULSI CMOS Technologies*, IEDM, pp. 133–136 (1998).

* cited by examiner

Primary Examiner—Ngân V. Ngô
(74) Attorney, Agent, or Firm—Girard & Equitz LLP

(57) ABSTRACT

A low stress active area silicon island structure with a reduced susceptibility to gate polysilicon layer "wrap-around" and stringer formation during subsequent semiconductor manufacturing. The structure includes a semiconductor substrate (e.g. a silicon wafer) with an electrical insulation layer (e.g. a SiO$_2$ layer) thereon. The electrical insulation layer has an active area opening extending from its surface to the surface of the underlying semiconductor substrate. The structure also includes an active area silicon island filling the active area opening. A cross-section of the active area silicon island perpendicular to the surface of the semiconductor substrate has a non-rectangular profile, for example a "wineglass" profile. A process for the formation of a low stress active area silicon island structure includes first providing a semiconductor substrate, followed by forming an electrical insulation layer thereon. An active area opening with a non-rectangular cross-sectional profile is then created in the electrical insulation layer, extending from its upper surface to the semiconductor substrate. An active area silicon layer is subsequently deposited, using a selective epitaxial silicon deposition process, to fill the active area opening and cover the electrical insulation layer. Next, the active area silicon layer is removed from the electrical insulation layer, while leaving the active area silicon layer in the active area opening. The removal of the active area silicon layer from the electrical insulation layer results in the formation of a low stress active area silicon island in the active area opening.

10 Claims, 2 Drawing Sheets

LOW STRESS ACTIVE AREA SILICON ISLAND STRUCTURE WITH A NON-RECTANGULAR CROSS-SECTION PROFILE AND METHOD FOR ITS FORMATION

BACKGROUND OF THE INVENTION

1. Field of the Invention

The present invention relates to semiconductor device structures and, in particular, to active area silicon island structures for use in semiconductor devices and methods for their manufacture.

2. Description of the Related Art

The manufacturing of semiconductor devices (e.g. MOS transistors, bipolar transistors, diodes, capacitors, resistors, etc.) typically involves their formation in, and on, an area of a silicon substrate that is known as the "active area silicon island" or simply "active area." An individual active area silicon island, and its associated semiconductor device(s), is customarily isolated from neighboring active area silicon islands by electrical isolation regions. A combination of an active area silicon island and its associated electrical isolation region can be designated as an active area silicon island structure. In deep sub-micron semiconductor device manufacturing, Shallow Trench Isolation (STI) processes are the most common method of forming active area silicon island structures.

In a conventional STI process, a trench with an essentially rectangular cross-section profile is first etched into a silicon substrate 10. A silicon dioxide ($SiO_2$) layer is subsequently deposited on the silicon substrate 10 (typically using a relatively expensive high density plasma-based [HDP] technique) and planarized to form a silicon dioxide ($SiO_2$) electrical isolation region 12 and active area silicon island 16, as shown in FIG. 1. The result of a conventional STI process is the formation of an active area silicon island structure 18 with relatively sharp corners 20, 22, 24 and 26 at the top and the bottom of the interface between the $SiO_2$ electrical isolation region 12 and the active area silicon island 16.

The corners 20, 22, 24 and 26 are an artifact of the essentially rectangular cross-section profile of both the active area 16 and the $SiO_2$ electrical isolation region 12. These relatively sharp corners create a high mechanical stress in the active area silicon island that can lead to a reduction in the integrity of a silicon dioxide gate subsequently grown thereon. Even if costly and time consuming procedures are implemented to (a) etch a trench with a slight sidewall angle (as a precursor to an active area with an essentially quadrilateral cross-section profile) or to (ii) lessen the sharpness of the corners 20, 22, 24 and 26 through a rounding of their profile, an undesirably high mechanical stress is still often present in active area silicon islands formed using conventional STI processes.

In addition, if the silicon dioxide layer is over-planarized, such that the upper surface of the resulting $SiO_2$ electrical isolation region 12 is below the upper surface of the active area silicon island 16, a subsequently deposited polysilicon gate layer can "wraparound" the top corners 20 and 22 of the active area silicon island 16. This "wraparound" can result in an undesirable transistor electrical phenomena known as "double hump" and/or short circuits between neighboring semiconductor devices due to the presence of polysilicon gate layer stringers. For a further discussion of the requirements and drawbacks of conventional STI processes, see M. Nandakumar et al., *Shallow Trench Isolation for Advanced ULSI CMOS Technologies*, IEDM, 133–136 (1998), which is hereby fully incorporated by reference.

U.S. Pat. No. 4,698,316 to Corboy, Jr. et al. and U.S. Pat. No. 5,592,792 to Corboy, Jr. et al., both of which are hereby incorporated by reference, describe epitaxial silicon deposition methods for the formation of "silicon islands" within the apertures of a silicon dioxide masking layer. The resulting silicon islands have a rectangular cross-section profile and are, therefore, subject to an undesirably high mechanical stress in a similar manner to active area silicon island structures formed using conventional STI processes.

Still needed in the art is an active area silicon island structure with low mechanical stress that is not susceptible to polysilicon gate layer "wraparound" or polysilicon gate layer stringer formation. Also needed is a process for its manufacture that is simple, inexpensive and compatible with standard semiconductor device processing.

SUMMARY OF THE INVENTION

The present invention provides a low stress active area silicon island structure with a reduced susceptibility to polysilicon gate layer "wraparound" and polysilicon gate layer stringer formation. An active area silicon island structure according to the present invention includes a semiconductor substrate (typically a silicon wafer) with an electrical insulation layer (formed, for example, of $SiO_2$, silicon nitride, or other dielectric material) disposed thereon. The electrical insulation layer has at least one active area opening therein that extends from the upper surface of the electrical insulation layer to the surface of the semiconductor substrate. An active area silicon island fills the active area opening. A cross-section of the active area silicon island, perpendicular to the surface of the semiconductor substrate, has a non-rectangular profile, such as a "wineglass" profile.

The non-rectangular profile of the active area silicon island provides an active area silicon island structure with relatively low mechanical stress, in comparison to the mechanical stress that is induced by the essentially rectangular profiles created by conventional STI processes. The relatively low mechanical stress is due, at least in part, to the absence of sharp corners at the top of the active area silicon island. One of ordinary skill in the art will recognize upon reading this disclosure, therefore, that the non-rectangular profile of active area silicon islands in structures according to the present invention encompasses (i) non-quadrilateral profiles, (ii) profiles wherein a major portion of the profile is curved (e.g. a wine-glass profile), and (iii) all other profiles that do not include sharp corners located, at least, in the proximity of the top of the active area silicon island.

The invention also provides a process for the formation of a low stress active area silicon island structure. The process first includes providing a semiconductor substrate, followed by forming an electrical insulation layer (e.g. a silicon dioxide or silicon nitride layer) thereon. At least one active area opening is then created in the electrical insulation layer, extending from the upper surface of the electrical insulation layer to the surface of the semiconductor substrate. A cross-section of the active area opening, taken perpendicular to the surface of the semiconductor substrate, has a non-rectangular profile, such as a wine-glass profile. Next, an active area silicon layer is deposited, using a selective epitaxial silicon deposition process, to fill the active area opening and cover the electrical insulation layer. The active area silicon layer is subsequently removed from the electrical insulation layer, as well as from the above the active area opening, while leaving the active area silicon layer in the active area opening. The removal of the active area silicon layer from the electrical insulation layer and from the above the active area opening results in the formation of an active area silicon island, in the active area opening, that has a cross-section (perpendicular to the surface of the semiconductor substrate) with a non-rectangular profile.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION OF THE INVENTION

In order to provide a clear and consistent understanding of the present invention and claims, the following definitions are provided:

The term "electrical insulation layer" refers both to single-layered films, including for example, silicon dioxide ($SiO_2$), silicon nitride ($Si_3N_4$), or other dielectric materials known in the art, and to multi-layered electrical insulation films (e.g., a silicon nitride layer underlying a silicon dioxide layer).

The term "silicon dioxide layer" includes $SiO_2$ layers formed by the decomposition of tetraethyl-orthosilicate (TEOS, $Si[OC_2H_5]_4$), layers based on the reaction of silane ($SiH_4$) or dichlorosilane ($SiCl_2H_2$), thermally grown silicon dioxide ($SiO_2$) layers and other $SiO_2$ layers known in the art.

Figure 1:
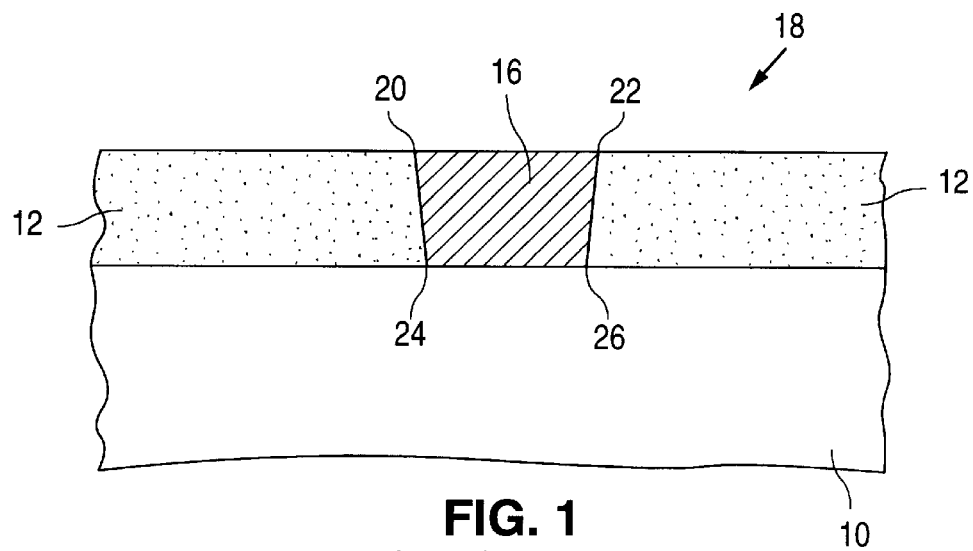
FIG. 1 is a cross-sectional view illustrating a conventional active area silicon island structure formed using conventional STI processing.
Figure 2:
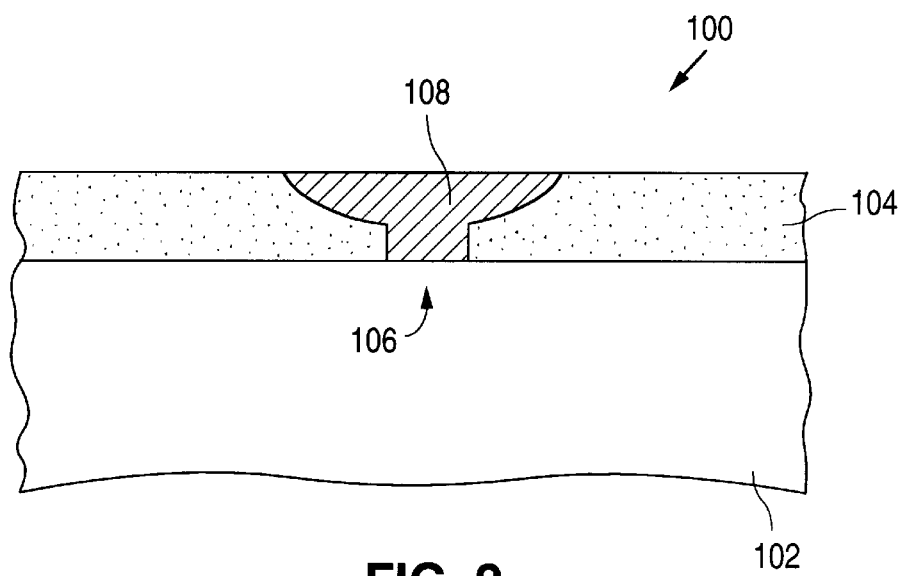
FIG. 2 is a cross-sectional view illustrating one embodiment of a low stress active area silicon island structure in accordance with the present invention.

FIG. 2 illustrates a low stress active area silicon island structure 100 in accordance with the present invention. Active area silicon island structure 100 includes a semiconductor substrate 102 with an electrical insulation layer 104 disposed thereon. Electrical insulation layer 104 includes at least one active area opening 106 therein that extends from the upper surface of the electrical insulation layer to the surface of the semiconductor substrate 102.

Semiconductor substrate 102 is typically a bare silicon wafer, although other semiconductor substrates known in the art can be used. Electrical insulation layer 104 can be, for example, a silicon dioxide layer, a silicon nitride layer, a low k dielectric layer, or a bilayer structure with a silicon nitride layer underlying a silicon dioxide layer.

Active area silicon island structure 100 also includes an active area silicon island 108 (formed, for example, of silicon, doped silicon, or a Si—Ge material deposited by selective silicon epitaxy) that extends from the upper surface of the electrical insulation layer 104, to the surface of the semiconductor substrate 102, filling the active area opening 106. A typical composition of an active area silicon island formed from a Si—Ge material includes a silicon atomic percentage in the range of 85% to 90% and a germanium atomic percentage in the range of 10% to 15%.

The active area silicon island 108 has a non-rectangular cross-sectional profile in the form of a "wine-glass" shape. Since the "wine-glass" profile does not have any sharp corners at its top surface, the active area silicon island structure 100 has relatively low mechanical stress.

Active area silicon island 108 can be doped to a predetermined resistivity using conventional semiconductor dopants such as boron (B), arsenic (As) or Phosphorus (P). A typical predetermined resistivity is in the range of 11 ohm-cm to 24 ohm-cm. The active area silicon island 108 has a typical thickness of less than 2 microns, and usually less than 1 micron. The width of the active area silicon island 108, measured at the surface of the electrical insulation layer 104, is typically no more than 1 micron and is usually in the range of 0.5 microns to 1.0 microns.

Figure 3:
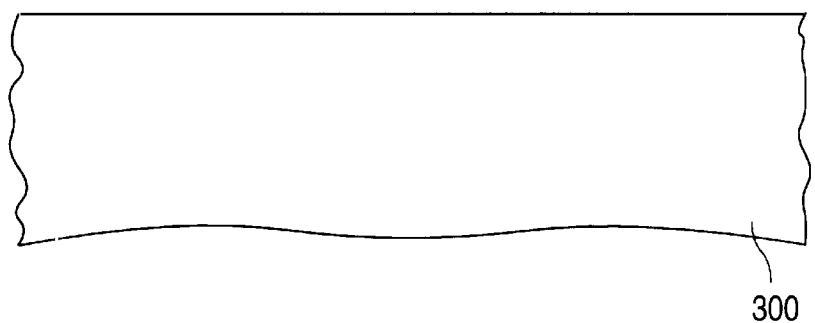
FIGS. 3–7 are cross-sectional views illustrating stages in a process in accordance with the present invention.
Figure 4:
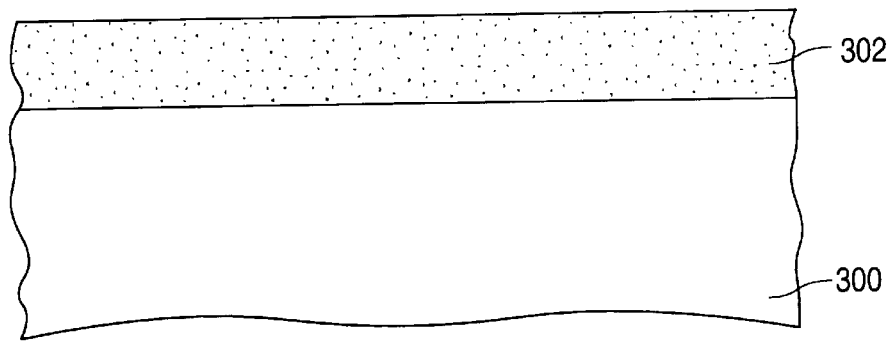

Also provided is a process for forming an active area silicon island structure according to the present invention that is simple, inexpensive and compatible with standard semiconductor device manufacturing techniques. In addition, active area silicon island structures formed by processes according to the present invention have relatively low mechanical stress and a decreased susceptibility to polysilicon gate layer "wraparound" and polysilicon gate layer stringer formation. FIGS. 4–8 illustrate, using cross-sectional views, stages of a process for the formation of an active area silicon island structure according to the present invention. A semiconductor substrate 300, typically a bare silicon wafer, is first provided, as illustrated in FIG. 3. An electrical insulation layer 302 is then formed or deposited on the semiconductor substrate 300, as shown in FIG. 4. A typical thickness for electrical insulation layer 302 is in the range of 0.5 microns to 2 microns. Electrical insulation layer 302 can be formed using conventional processes that are well known in the art, such as deposition of a silicon dioxide layer (e.g. a TEOS-based $SiO_2$ layer or an $SiO_2$ layer formed using high density plasma [HDP] processing), a low k dielectric material, silicon nitride, or even a sandwich of $SiO_2$ and $Si_3N_4$. Electrical insulation layer 302 can also be a thermally grown silicon dioxide layer.

Figure 5:
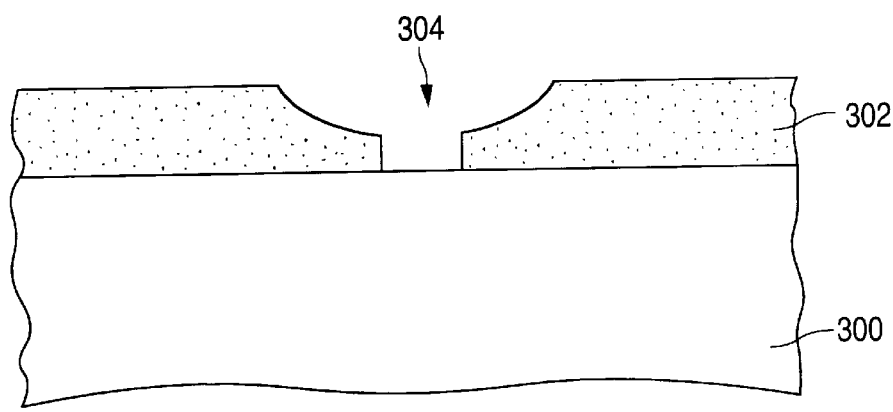

Next, at least one active area opening 304 is created in the electrical insulation layer 302. The active area opening extends from the top surface of the electrical insulation layer 302, through the electrical insulation layer 302, to the surface of the semiconductor substrate 300. In processes according to the present invention, a cross-section profile of the active area opening 304 taken perpendicular to the upper surface of the semiconductor substrate 300 (i.e. a cross-section as illustrated in FIGS. 4–8) is non-rectangular and, preferably, non-quadrilateral or such that a major portion of the profile is curved. FIG. 5 illustrates an embodiment in accordance with the present invention wherein the profile has a "wine-glass" shape.

Active area openings can be created in processes according to the present invention using, for example, conventional photolithographic masking techniques and conventional wet chemistry and plasma etching techniques that are well known in the art. A conventional plasma etch can be conducted in, for example, a LAM oxide etcher, while a conventional wet chemistry etch can utilize a buffered oxide etchant (BOE) or HF acid. A typical wet chemistry etch can be conducted at room temperature using a 6:1 $BOE:H_2O$ mixture or a 10:1 $HF:H_2O$ mixture with a silicon dioxide etch rate of approximately 300 angstroms per minute. The sequence of an anisotropic plasma etch followed by an isotropic wet chemistry can, for example, be used to define an active area opening with a "wine-glass" profile (as illustrated in FIG. 5).

The dimensions of the active area opening in processes according to the present invention depends on variety of factors, such as the reaction mechanism of the wet chemistry or plasma etch technique used to create the active area opening, the chemical composition of the electrical insulation layer, and the duration of the wet chemistry or plasma etch. A typical width of an active area opening, measured at the surface of the electrical insulation layer, is in the range of from 0.5 microns to 1 micron, although smaller widths of less than 0.5 microns can be useful for providing an active area silicon island structure on which relatively small semiconductor devices (e.g., a diode) will be subsequently formed.

When the electrical insulation layer 302 is a bilayer electrical insulation layer that includes a silicon nitride layer underlying a silicon dioxide layer, the silicon nitride layer can act as an etch stop layer during formation of the portion of the active area opening that extends through the silicon dioxide layer. The silicon nitride layer can then be etched using, for example, hot phosphoric acid to complete the formation of the active area opening.

Figure 6:
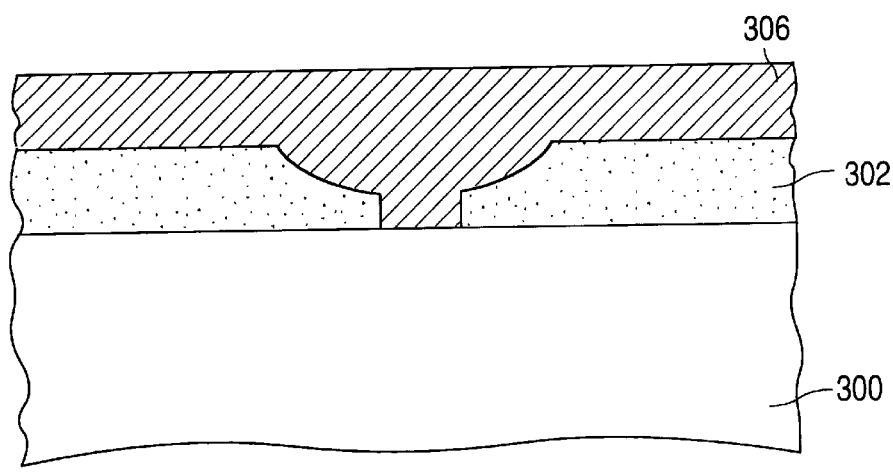

Next, an active silicon layer 306 is formed in the active area opening 304 and on the electrical isolation layer 302, as illustrated in FIG. 6, using a conventional selective epitaxial silicon deposition process. A conventional selective epitaxial silicon deposition process can employ, for example, silane ($SiH_4$) gas and be conducted at a temperature of 760° C. in an ASM Epsilon One reactor. Active silicon layer 306 can be, for example, a silicon layer, an in-situ doped silicon layer or a Si—Ge material layer. A typical germanium composition for a Si—Ge material layer is a germanium atomic percentage in the range of 10% to 15%. The thickness of the active area silicon layer 306 above the electrically insulating layer 302 is typically 1500 angstroms.

Figure 7:
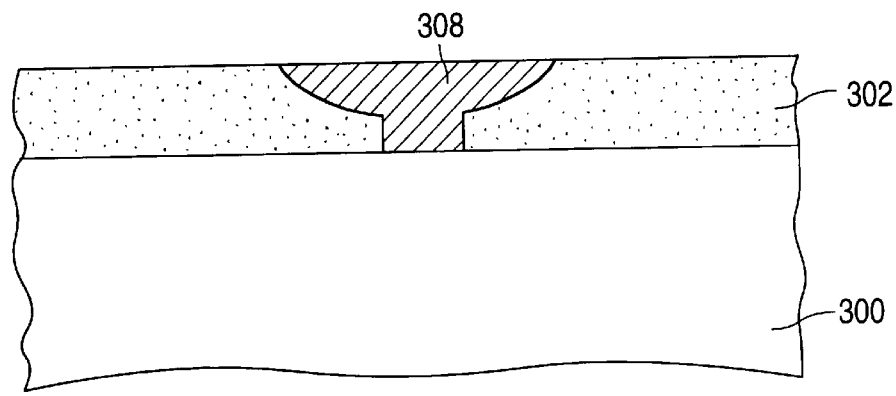

The active area silicon layer 306 is subsequently removed from the upper surface of the electrical insulation layer 302 and from above the active area opening 304, but not from within the active area opening, thereby forming an active area silicon island 308 in the active area opening, as illustrated in FIG. 7.

The active area silicon layer 306 can be removed using conventional chemical mechanical planarization (CMP) processes or conventional plasma etch-back processes. A CMP process can, for example, utilize three steps: a high rate planarization step, an intermediate planarization rate step and a final planarization (buff) step. A high rate planarization step would typically employ a colloidal or fumed silica slurry (e.g. a Nalco 2350, Nalco 2354, Nalco 2370, Rodel 1520 or Rodel 1540 slurry) to obtain a planarization rate of 0.8–1.3 microns per minute. For an intermediate planarization rate step, Rodel LS10 slurry at a planarization rate of 0.3–1.0 microns per minute can be employed. For a final planarization step, Rodel's LS10, Nalco 2360 or Advansil 2000 slurry can be employed to obtain a planarization rate of 0.03–0.05 microns per min. A plasma etch-back process can employ, for example, an $HBr/O_2$ based plasma chemistry.

Processes according to the present invention are fully compatible with conventional semiconductor device processing since the unique sequence of steps can be performed using conventional semiconductor processing techniques. This conventional processing provides for the low cost formation of a low stress active area silicon island structure.

Benefits of active area silicon island structures according to the present invention include relatively low stress in the active area silicon islands, compared to active area silicon islands formed using either conventional STI processes or to the "silicon islands" formed using conventional selective epitaxial growth process. In addition, since active area silicon structures according to the present invention can include active area silicon islands that are significantly narrower at their bottom than their top (for example, a wine-glass profile), electrical interaction (e.g., cross-talk and other electrical noise creating interactions) between a semiconductor device formed in one active area silicon island and a semiconductor device formed in a neighboring active area silicon island is minimized. This is because the bottoms of neighboring active area silicon islands are farther apart than the case of a rectangular active area silicon island, thereby forcing current to travel farther before causing such electrical interactions.

The non-rectangular profile (e.g. a wine-glass) of the active area silicon island in structures and processes according to the present invention provides for a relatively low stress active area silicon island since there are no sharp corners, at least, in the proximity of the top of the active area silicon island. In addition, since processes according to the present invention involve the removal of an active area silicon layer to form an active area silicon island, there is little possibility that the upper surface of the electrical isolation layer will be recessed below the upper surface of the active area silicon island. Active area silicon island structures formed using processes according to the present invention, therefore, have a reduced susceptibility to gate polysilicon layer "wraparound" and gate polysilicon layer stringer formation.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A low stress active area silicon island structure for use in semiconductor devices, the structure comprising:

a semiconductor substrate;

an electrical insulation layer disposed on the semiconductor substrate, the electrical insulation layer having at least one active area opening therein that extends from the upper surface of the electrical insulation layer to the surface of the semiconductor substrate;

an active area silicon island filling the active area opening, wherein a cross-section of the active area silicon island filling the active area opening perpendicular to the surface of the semiconductor substrate has a wine-glass profile.

2. The low stress active area silicon island structure of claim 1 wherein a major portion of the profile is curved.

3. The low stress active area silicon island structure of claim 1 wherein the active area silicon island is formed from epitaxially deposited silicon.

4. The low stress active area silicon island structure of claim 1 wherein the electrically insulating layer is selected from the group consisting of a silicon dioxide layer, a low k dielectric layer, a silicon nitride layer and a bilayer structure of a silicon nitride layer underlying a silicon dioxide layer.

5. The low stress active area silicon island structure of claim 1 wherein active area silicon island is formed of a Si—Ge material using a Si—Ge epitaxial deposition process.

6. The low stress active area silicon island structure of claim 5 wherein the active area silicon island is formed from a Si—Ge material with a silicon atomic percentage in the range of 85% to 90% and a germanium atomic percentage in the range of 10% to 15%.

7. The low stress active area silicon island structure of claim 1 wherein the active area silicon island has a thickness of less than 2 microns.

8. The low stress active area silicon island structure of claim 1 wherein the active area silicon island has a thickness of less than 1 micron.

9. The low stress active area silicon island structure of claim 1 wherein the active area silicon island has a width at the surface of the electrical insulation layer of less than 1 micron.

10. The low stress active area silicon island structure of claim 1 wherein the active area silicon island has a width at the surface of the electrical insulation layer in the range of 0.5 microns to 1.0 microns.

* * * * *

UNITED STATES PATENT AND TRADEMARK OFFICE
CERTIFICATE OF CORRECTION

PATENT NO. : 6,225,666 B1
DATED : May 1, 2001
INVENTOR(S) : Kamesh V. Gadepally

It is certified that error appears in the above-identified patent and that said Letters Patent is hereby corrected as shown below:

Title page,
Correct the fourth Reference Cited to read -- [56]   4,489,478   12/1984 Sakurai --

Signed and Sealed this

Thirteenth Day of November, 2001

Attest:

*Nicholas P. Godici*

NICHOLAS P. GODICI
*Attesting Officer*   *Acting Director of the United States Patent and Trademark Office*